(12) United States Patent  (10) Patent No.: US 8,542,478 B2
Momo et al.  (45) Date of Patent: Sep. 24, 2013

(54) ELECTRIC DOUBLE LAYER CAPACITOR, LITHIUM ION CAPACITOR, AND CHARGING DEVICE

(75) Inventors: Junpei Momo, Kanagawa (JP); Yumiko Saito, Kanagawa (JP); Rie Matsubara, Kanagawa (JP); Hiroatsu Todoriki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 29 days.

(21) Appl. No.: 13/298,588

(22) Filed: Nov. 17, 2011

(65) Prior Publication Data

US 2012/0126231 A1  May 24, 2012

(30) Foreign Application Priority Data

Nov. 19, 2010  (JP) ................. 2010-259280

(51) Int. Cl.
*H01L 31/042* (2006.01)
*H01G 9/016* (2006.01)
*H01G 9/155* (2006.01)

(52) U.S. Cl.
USPC ............................ 361/502; 136/244; 361/505

(58) Field of Classification Search
USPC .................... 361/502, 505; 136/244
See application file for complete search history.

(56) References Cited

U.S. PATENT DOCUMENTS

| 6,174,070 | B1* | 1/2001 | Takamura et al. | 362/183 |
|---|---|---|---|---|
| 6,843,810 | B2* | 1/2005 | Nakazawa et al. | 29/25.03 |
| 6,862,167 | B1* | 3/2005 | Banno et al. | 361/502 |
| 7,198,654 | B1* | 4/2007 | Kim et al. | 29/25.03 |
| 2004/0197662 | A1* | 10/2004 | Maruyama et al. | 429/303 |
| 2010/0209784 | A1 | 8/2010 | Yamazaki et al. | |
| 2010/0307558 | A1 | 12/2010 | Yamazaki et al. | |
| 2010/0307559 | A1 | 12/2010 | Yamazaki et al. | |
| 2011/0073561 | A1 | 3/2011 | Yamazaki et al. | |
| 2011/0073991 | A1 | 3/2011 | Kuriki et al. | |
| 2011/0075322 | A1 | 3/2011 | Kuriki et al. | |
| 2011/0075325 | A1 | 3/2011 | Ito et al. | |
| 2011/0212363 | A1 | 9/2011 | Yamazaki et al. | |
| 2011/0236567 | A1 | 9/2011 | Kuriki | |

FOREIGN PATENT DOCUMENTS

| JP | 11-260669 | 9/1999 |
|---|---|---|
| JP | 2002-170967 | 6/2002 |
| JP | 2004-221531 | 8/2004 |
| JP | 2010-34300 | 2/2010 |
| JP | 2010-135361 | 6/2010 |

\* cited by examiner

*Primary Examiner* — Evan Pert

(74) *Attorney, Agent, or Firm* — Husch Blackwell LLP

(57) ABSTRACT

An electric double layer capacitor, a lithium ion capacitor, and a charging device including a solar cell and either of the capacitors are disclosed. The electric double layer capacitor includes a first and second light-transmitting substrates; a pair of current collectors provided perpendicular to the substrates; active material layers provided on facing planes of the current collectors; and an electrolyte in a region surrounded by the substrates and the facing active material layers. The lithium ion capacitor includes a first and second light-transmitting substrates; a positive and negative electrode active material layers provided perpendicular to the substrates; and an electrolyte in a region surrounded by the facing substrates and the positive and negative electrode active material layers.

20 Claims, 11 Drawing Sheets

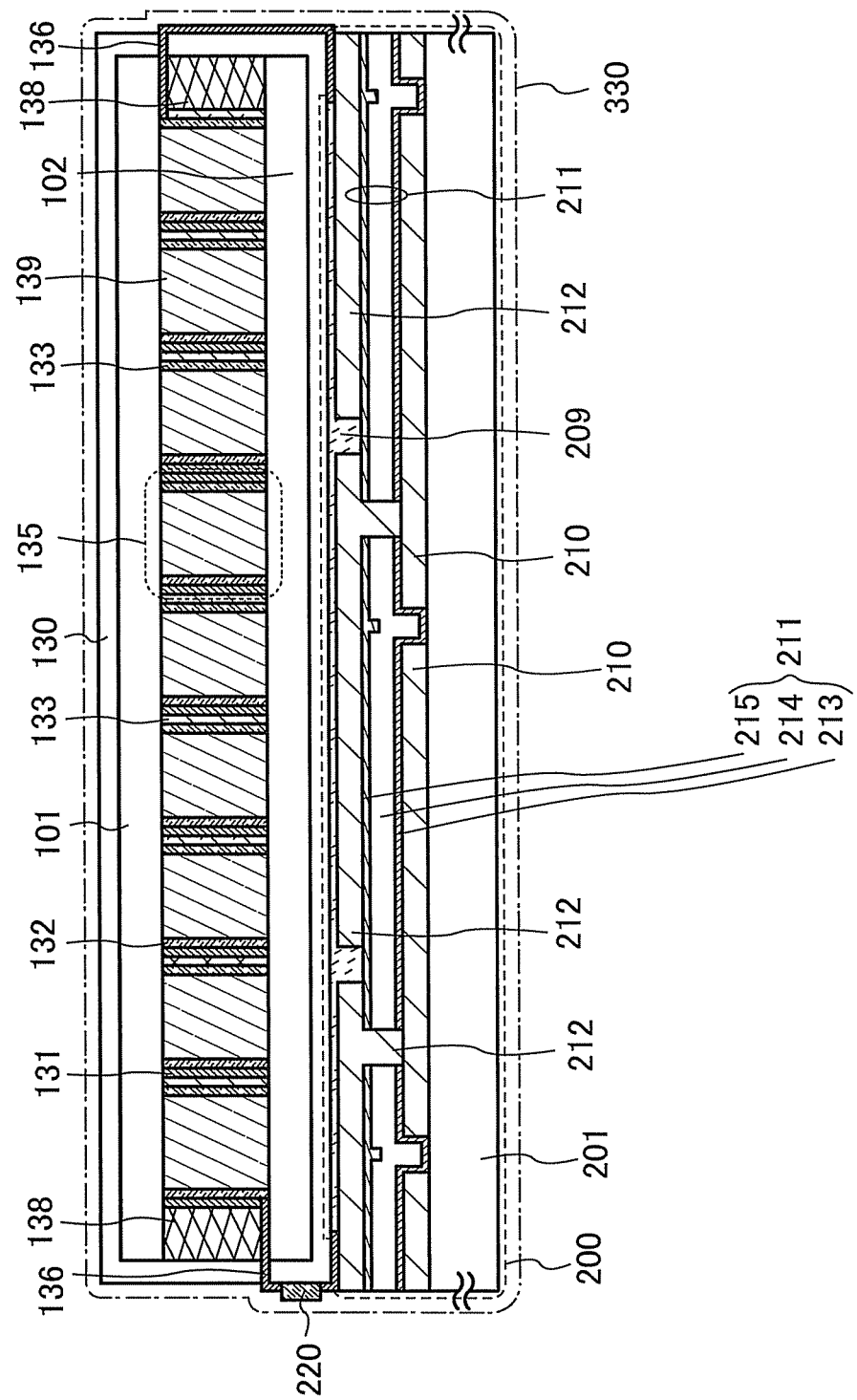

ELECTRIC DOUBLE LAYER CAPACITOR, LITHIUM ION CAPACITOR, AND CHARGING DEVICE

BACKGROUND OF THE INVENTION

1. Field of the Invention

One embodiment of the disclosed invention relates to an electric double layer capacitor, a lithium ion capacitor, and a charging device.

2. Description of the Related Art

Solar energy has many advantages over an energy source which has been in the mainstream in recent years. For example, solar energy is virtually infinite and can be used all over the world.

Solar energy is effectively used in a variety of fields. In a building or a car, for example, a portion which is irradiated with sunlight is provided with a solar cell and the solar energy is converted into electricity by the solar cell. The electricity obtained in this manner can be used as part of lighting for a building or a power source for a car.

Solar energy can be obtained in daytime when sunlight can be obtained; however, if electricity obtained as the above is stored, the electricity can also be used at night time or at the time of rain when sunlight cannot be obtained. Accordingly, solar energy is an energy source with which valuable natural resources are not reduced and destroyed (see Patent Document 1).

As power storage systems (also referred to as a power storage device) which store electricity converted by a solar cell, a secondary battery, an electrochemical capacitor, or the like can be given.

As an electrochemical capacitor, a hybrid capacitor such as a lithium ion capacitor (see Patent Document 2), an electric double layer capacitor (EDLC) (see Patent Documents 3 and 4), and the like have been developed.

REFERENCE

[Patent Document 1] Japanese Published Patent Application No. 2002-170967
[Patent Document 2] Japanese Published Patent Application No. 2010-135361
[Patent Document 3] Japanese Published Patent Application No. H11-260669
[Patent Document 4] Japanese Published Patent Application No. 2004-221531

SUMMARY OF THE INVENTION

Since a solar cell generates power by absorbing light and has a structure in which at least visible light is absorbed in a semiconductor layer, the solar cell is opaque. As a solar cell disclosed in Patent Document 1, when a structure in which a semiconductor layer is sandwiched between light-transmitting electrodes is employed, the solar cell can have a light-transmitting property. However, also in this case, most of visible light is absorbed in a semiconductor layer, and the solar cell has a characteristic of transmitting only light in a specific wavelength range (light with a wavelength less than or equal to the band-gap energy of a semiconductor).

In a conventional electric double layer capacitor described in Patent Document 3, a current collector or an active material is formed using a non-light-transmitting material. That is, the conventional electric double layer capacitor is a non-light-transmitting power storage device.

In a power storage device such as a secondary battery or an electrochemical capacitor, in addition to charge capacity or charge-discharge cycle characteristics, only reduction in thickness or miniaturization has attracted attention, and a light-transmitting property has not been discussed. Therefore, it has been difficult to make the conventional secondary battery, the conventional electrochemical capacitor, or the like have more functions by combination with a solar cell since the conventional secondary battery, the conventional electrochemical capacitor, or the like blocks light.

When a power storage device can transmit light, the power storage device can be overlapped with a solar cell. When the power storage device and the solar cell can be overlapped with each other, the area occupied by them can be reduced as compared to the case where they are separately provided.

In view of the foregoing, an object of one embodiment of the disclosed invention is to provide a power storage device including a region through which light is transmitted, while keeping a charging and discharging function.

Another object of one embodiment of the disclosed invention is to reduce an area occupied by a solar cell and a power storage device.

According to one embodiment of the disclosed invention, a power storage device including a region through which light is transmitted is provided.

According to one embodiment of the disclosed invention, a charging device is provided in which a solar cell and a power storage device each including a region through which light is transmitted are overlapped with each other.

The solar cell and the power storage device each including a region through which light is transmitted are overlapped with each other, whereby the area occupied by the solar cell and the power storage device can be reduced.

One embodiment of the disclosed invention relates to an electric double layer capacitor including a first substrate having a light-transmitting property and a second substrate having a light-transmitting property, which face each other; a pair of current collectors which are provided so as to be perpendicular to the first substrate and the second substrate and which are sandwiched between the first substrate and the second substrate; a first active material layer provided on a plane of one of the pair of current collectors and a second active material layer provided on a plane of the other of the pair of current collectors, wherein the planes face each other; and an electrolyte provided in a region surrounded by the first substrate and the second substrate which face each other and the active material layers which face each other.

One embodiment of the disclosed invention relates to a charging device including an electric double layer capacitor and a solar cell. The electric double layer capacitor includes a first substrate having a light-transmitting property and a second substrate having a light-transmitting property, which face each other; a pair of current collectors which are provided so as to be perpendicular to the first substrate and the second substrate and which are sandwiched between the first substrate and the second substrate; a first active material layer provided on a plane of one of the pair of current collectors and a second active material layer provided on a plane of the other of the pair of current collectors, wherein the planes face each other; an electrolyte provided in a region surrounded by the first substrate and the second substrate which face each other and the active material layers which face each other; and wirings electrically connected to the pair of current collectors. The solar cell includes, over a third substrate having a light-transmitting property, a first conductive film having a light-transmitting property, a photoelectric conversion layer provided in contact with the first conductive film, and a second conductive having a light-transmitting property and provided in contact with the photoelectric conversion layer. The electric double layer capacitor and the solar cell are electrically connected to each other through the wirings which are electrically connected to the current collectors, the first conductive film, and the second conductive film.

In the above charging device of one embodiment of the disclosed invention, one or more electric double layer capacitor which are the same as the electric double layer capacitor are further provided, and the electric double layer capacitors are connected in series.

In the above charging device of one embodiment of the disclosed invention, one or more electric double layer capacitor which are the same as the electric double layer capacitor are further provided, and the electric double layer capacitors are connected in parallel.

One embodiment of the disclosed invention relates to a lithium ion capacitor including a first substrate having a light-transmitting property and a second substrate having a light-transmitting property, which face each other; a positive electrode including a positive electrode current collector and a positive electrode active material layer and a negative electrode including a negative electrode current collector and a negative electrode active material layer, which are provided so as to be perpendicular to the first substrate and the second substrate and which are sandwiched between the first substrate and the second substrate; and an electrolyte provided in a region surrounded by the first substrate and the second substrate which face each other and the positive electrode active material layer and the negative electrode active material layer.

One embodiment of the disclosed invention relates to a charging device including a lithium ion capacitor and a solar cell. The lithium ion capacitor includes a first substrate having a light-transmitting property and a second substrate having a light-transmitting property, which face each other; a positive electrode including a positive electrode current collector and a positive electrode active material layer and a negative electrode including a negative electrode current collector and a negative electrode active material layer, which are provided so as to be perpendicular to the first substrate and the second substrate and which are sandwiched between the first substrate and the second substrate; an electrolyte provided in a region surrounded by the first substrate and the second substrate which face each other and the positive electrode active material layer and the negative electrode active material layer; and wirings electrically connected to the positive electrode current collector and the negative electrode current collector. The solar cell includes, over a third substrate having a light-transmitting property, a first conductive film having a light-transmitting property, a photoelectric conversion layer provided in contact with the first conductive film, and a second conductive film having a light-transmitting property and provided in contact with the photoelectric conversion layer. The lithium ion capacitor and the solar cell are electrically connected to each other through the wirings electrically connected to the positive electrode current collector and the negative electrode current collector, the first conductive film, and the second conductive film.

In the above charging device of one embodiment of the disclosed invention, one or more lithium ion capacitor which are the same as the lithium ion capacitor are further provided, and the lithium ion capacitors are connected in series.

In the above charging device of one embodiment of the disclosed invention, one or more lithium ion capacitor which are the same as the lithium ion capacitor are further provided, and the lithium ion capacitors are connected in parallel.

In one embodiment of the disclosed invention, the photoelectric conversion layer is any of an amorphous semiconductor layer, a polycrystalline semiconductor layer, and a microcrystalline semiconductor layer.

In one embodiment of the disclosed invention, the photoelectric conversion layer includes a p-type semiconductor layer, an intrinsic semiconductor layer, and an n-type semiconductor layer.

According to one embodiment of the disclosed invention, it is possible to provide a power storage device including a region through which light is transmitted, while keeping a charging and discharging function.

According to one embodiment of the disclosed invention, an area occupied by a solar cell and a power storage device can be reduced.

BRIEF DESCRIPTION OF THE DRAWINGS

FIG. 8 is a cross-sectional view illustrating a charging device in which a solar cell and a lithium ion capacitor are overlapped with each other.

DETAILED DESCRIPTION OF THE INVENTION

Figure 1A:
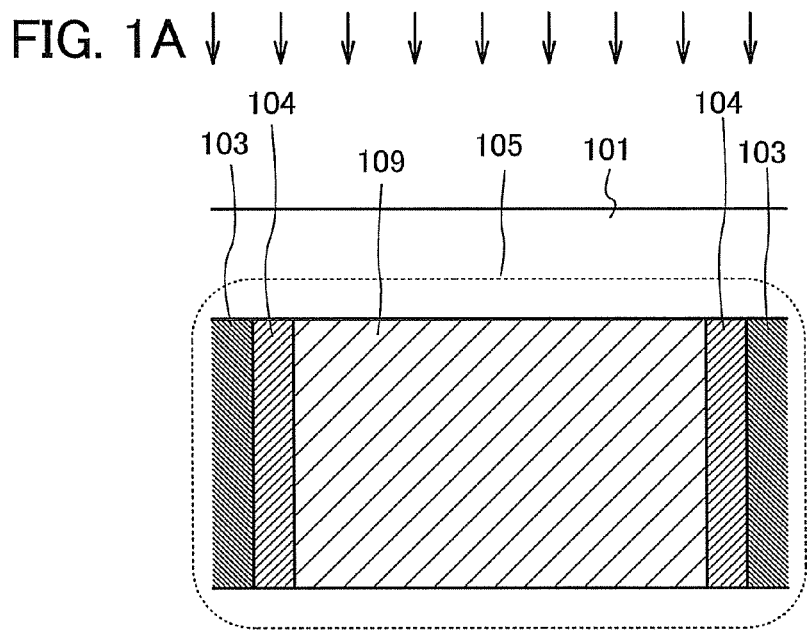
FIGS. 1A to 1C are cross-sectional views each illustrating an electric double layer capacitor.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to description of the embodiments. Note that, in the drawings hereinafter shown, the same portions or portions having similar functions are denoted by the same reference numerals, and repeated description thereof will be omitted.

<Electric Double Layer Capacitor>

FIG. 1A illustrates an electric double layer capacitor of this embodiment. An electric double layer capacitor 105 in FIG. 1A includes a pair of current collectors 103, active material layers 104 provided on the current collectors 103, and a light-transmitting electrolyte 109. The active material layers 104 are provided on planes of the current collectors 103, which face each other. Note that in this specification, a current collector and an active material layer are collectively referred to as an electrode.

The electric double layer capacitor 105 is provided between a light-transmitting substrate 101 and a light-transmitting substrate 102 which face each other. The substrate 101, the substrate 102, the current collectors 103, and the active material layers 104 are provided so that planes of the substrates 101 and 102, which face each other, and planes of a pair of electrodes (the current collectors 103 and the active material layers 104), which face each other, are perpendicular to each other. Thus, the electrolyte 109 can be provided in a region surrounded by the substrates 101 and 102 which face each other and the active material layers 104 which face each other.

As the light-transmitting substrates 101 and 102, for example, any of a glass substrate, a plastic film formed using polyethylene terephthalate, polyimide, an acrylic resin, polycarbonate, polypropylene, polyester, polyvinyl chloride, or the like, and the like can be used.

The current collector 103 is formed using a metal material, and for example, aluminum or stainless steel can be used. In addition, the current collector 103 has a flat shape and is sandwiched between the substrates 101 and 102 so as to be substantially perpendicular to the substrates.

The current collector 103 also functions as a spacer for maintaining a space between the substrates 101 and 102. Since the current collector 103 functions as the spacer, a spacer is not necessarily provided in addition to the current collector 103. Therefore, manufacturing cost can be reduced, which is preferable.

The active material layer 104 is formed using active carbon or a polyacenic material, which has a large specific surface area.

The thicknesses of the current collector 103 and the active material layer 104 are preferably reduced as much as possible so that they do not prevent incident light. However, since the current collector 103 functions as the spacer for maintaining the space between the substrate 101 and the substrate 102, the current collector 103 has a thickness with which it can function as the spacer and with which incident light can be prevented as little as possible.

The thickness of the active material layer 104 is also reduced as much as possible. Active carbon or a polyacenic material, which has a large specific surface area, is preferably used for the active material layer 104, in which case the thickness of the active material layer 104 can be reduced.

As the electrolyte 109, an electrolyte solution that is an electrolyte in a liquid state or a solid electrolyte may be used. Note that, as the electrolyte 109, a light-transmitting electrolyte solution or a solid light-transmitting electrolyte is necessarily used. In the case where an electrolyte solution is used as the electrolyte 109, a separator may be provided between electrodes and the inside of the separator may be impregnated with the electrolyte solution. In the case where the inside of the separator is impregnated with the electrolyte solution, a light-transmitting material is also used for the separator.

The electrolyte solution is a solution in which an ion compound is dissolved in a solvent and can be categorized mainly into an aqueous solution-based electrolyte solution and an organic-based (non-aqueous solution-based) electrolyte solution. In the case where the electrolyte solution is used as the electrolyte 109, examples of the solvent of an organic base include cyclic carbonates such as ethylene carbonate (EC), propylene carbonate (PC), butylene carbonate (BC), and vinylene carbonate (VC); acyclic carbonates such as dimethyl carbonate (DMC), diethyl carbonate (DEC), ethylmethyl carbonate (EMC), methylpropyl carbonate (MPC), isobutyl methyl carbonate, and dipropyl carbonate (DPC); sulfones such as sulfolane (SL) and 3-methylsulfolane (MSL); nitriles such as acetonitrile; alcohols such as methanol; acyclic chain esters such as methyl formate, methyl acetate, methyl propionate, and ethyl propionate; cyclic esters such as γ-butyrolactone and γ-valerolactone; acyclic ethers such as dimethoxymethane, 1,2-dimethoxyethane (DME), 1,2-diethoxyethane (DEE), and ethoxymethoxy ethane (EME); cyclic ethers such as tetrahydrofuran, 2-methyltetrahydrofuran, and tetrahydropyran; dimethylsulfoxide; 1,3-dioxolane; alkyl phosphate esters such as trimethyl phosphate, triethyl phosphate, and trioctyl phosphate; and fluorides thereof. All of the above solvents can be used either alone or in combination as the electrolyte 109.

As an anion which constitutes an ion compound, tetrafluoroborate ion ($BF_4^-$), hexafluorophosphate anion ($PF_6^-$), perchlorate ion ($ClO_4^-$), bis(trifluoromethylsulfonyl)imide anion (($CF_3SO_2)_2N^-$), or the like can be used. As an cation which constitutes an ion compound, other than lithium ion, ammonium such as triethylmethylammonium ion, tetramethylammonium ion ($(CH_3)_4N^+$, and tetraethylammonium ion ($(C_2H_5)_4N)^+$ and amidine such as ethylmethylimidazolium cation can be used.

A combination of the above-mentioned solvents and the ion compound is decided while considering that it is preferable to combine an ion compound and a solvent in which the solubility of the ion compound in the solvent is high and ionization is easy.

Note that a high molecular polymer and an organic plasticizer may be added to the above-mentioned solvent, and the electrolyte solution may be in a gel state.

In the case where a solid electrolyte is used as the electrolyte 109, for example, a solid light-transmitting electrolyte such as a film of polyethylene oxide (abbreviation: PEO) may be used.

In FIG. 1A, arrows show a light incident direction. The current collectors 103 and the active material layers 104 of the electric double layer capacitor 105 in FIG. 1A are provided parallel to the light incident direction. Therefore, the current collectors 103 and the active material layers 104 prevent transmission of incident light as little as possible, which is preferable. In the electric double layer capacitor 105 in this embodiment, a region other than the current collectors 103 and the active material layers 104 is a region through which light is transmitted. Thus, as described above, the thicknesses of the current collector 103 and the active material layer 104 are reduced as much as possible so that they do not prevent incident light.

Thus, an electric double layer capacitor including a region through which light is transmitted can be obtained.

Figure 1B:
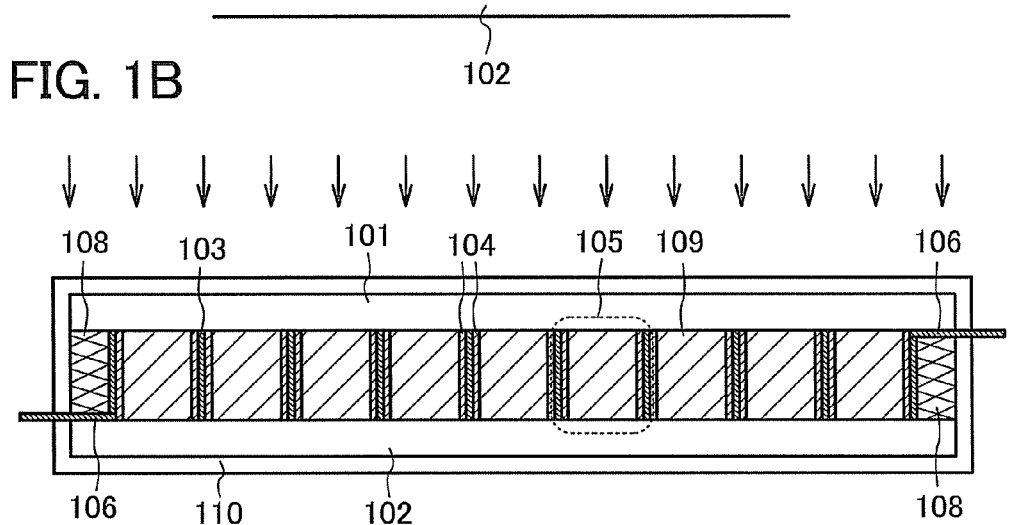
Figure 10A:
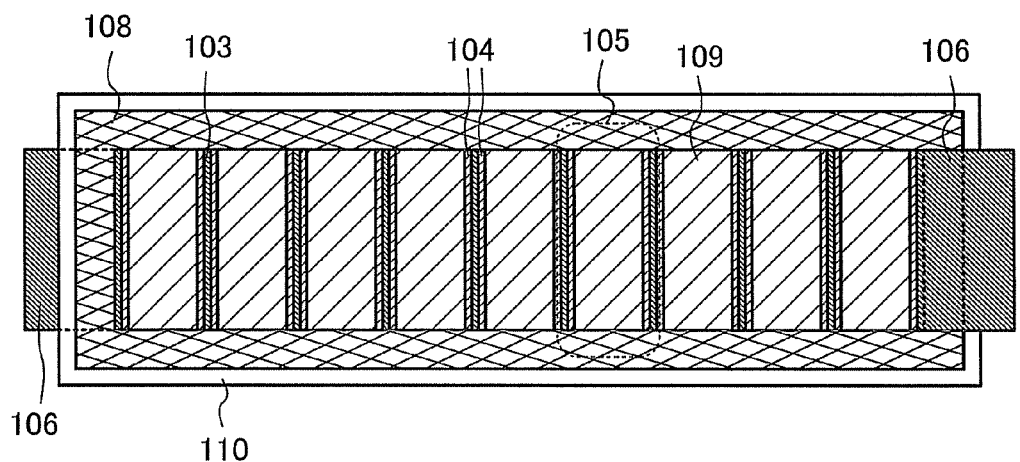
FIGS. 10A and 10B are top views each illustrating an electric double layer capacitor.

FIG. 1B illustrates a structure in which a plurality of electric double layer capacitors 105 in FIG. 1A is connected in series. In addition, FIG. 10A is a top view of the electric double layer capacitors 105 connected in series in FIG. 1B.

Figure 1C:
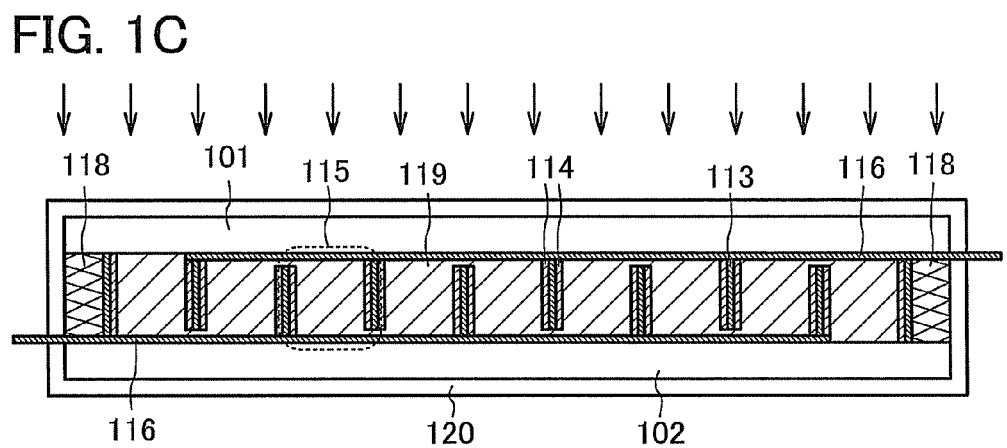

A predetermined voltage can be obtained in the following manner: the plurality of electric double layer capacitors 105 is connected in series as illustrated in FIG. 1B or a plurality of electric double layer capacitors 115 is connected in parallel as illustrated in FIG. 1C, which is described later.

In the structure of FIG. 1B, a plurality of current collectors 103 and a plurality of active material layers 104 are provided between the light-transmitting substrates 101 and 102. The active material layers 104 are provided on a first plane and a second plane which is opposite to the first plane of the current collector 103. Note that the active material layer 104 is provided on only one plane of the current collector 103 provided on the outermost side.

As described above, the substrate 101, the substrate 102, the current collectors 103, and the active material layers 104 are placed so that planes of the substrates 101 and 102, which face each other, and planes of a pair of electrodes (the current collectors 103 and the active material layers 104), which face each other, are perpendicular to each other. Thus, the electrolyte 109 can be provided in a region surrounded by the substrates 101 and 102 which face each other, the active material layer 104 provided on the first plane of the current collector 103, and the active material layer 104 provided on the second plane of the adjacent current collector 103.

The electric double layer capacitor 105 includes adjacent current collectors 103, active material layers 104 provided on planes of the adjacent current collectors 103, which face each other, and the electrolyte 109. Note that the planes of the adjacent current collectors 103, which face each other, can also be referred to as a first plane of an arbitrary current collector 103 and a second plane of a current collector 103 which is adjacent to the arbitrary current collector 103.

Note that when the electric double layer capacitors 105 are connected in series as illustrated in FIG. 1B, it is necessary that the electrodes are completely separated from each other and the electrolyte 109 is divided for each electric double layer capacitor 105. When the electrolyte 109 is not divided for each electric double layer capacitor 105, the electric double layer capacitors 105 cannot be connected in series.

Therefore, in the case where the electric double layer capacitors 105 are connected in series as illustrated in FIG. 1B, when the cross-sectional view thereof is seen, the electrolyte 109 is provided in a region surrounded by the substrate 101, the substrate 102, the active material layer 104 provided on the first plane of the current collector 103, and the active material layer 104 provided on the second plane of an adjacent current collector 103. Further, when a plan view is seen (see FIG. 10A), the electrolyte 109 is provided in a region surrounded by the active material layer 104 provided on the first plane of the current collector 103, the active material layer 104 provided on the second plane of the adjacent current collector 103, and a sealant 108.

The substrate 101, the substrate 102, the current collectors 103, the active material layers 104, and the electrolyte 109 are provided inside a light-transmitting exterior material 110. As the light-transmitting exterior material 110, a light-transmitting laminate film, a light-transmitting high molecular film, a light-transmitting plastic case, or the like can be used.

Of the plurality of electric double layer capacitors 105, two electric double layer capacitors 105 are provided on opposite outermost sides. Wirings 106 are connected to the current collectors 103 of the electric double layer capacitors 105 on the outermost sides and are provided outside the exterior material 110. The sealant 108 for preventing leakage of the electrolyte 109 is provided in a region surrounded by the exterior material 110 and the current collectors 103 of the electric double layer capacitors 105 on the outermost sides.

In the structure where the electric double layer capacitors 105 are connected in series as illustrated in FIG. 1B, only the current collectors 103 of the electric double layer capacitors 105 provided on the outermost sides are provided with the wirings 106 provided outside the exterior material 110. The wirings 106 are preferably formed using a light-transmitting conductive material; however, in the case where the distance between one of the current collectors 103 of the electric double layer capacitors 105 provided on the outermost sides and one end portion of the substrate 101 (or the substrate 102) and the distance between the other of the current collectors 103 of the electric double layer capacitors 105 provided on the outermost sides and another end portion of the substrate 101 (or the substrate 102) are short, a non-light-transmitting conductive material may be used as a material of the wirings 106.

As a light-transmitting conductive material, for example, water-dispersible polyester, indium tin oxide, indium tin oxide including silicon oxide, organoindium, organotin, zinc oxide (ZnO), indium zinc oxide including zinc oxide, zinc oxide doped with gallium (Ga), tin oxide ($SnO_2$), indium oxide including tungsten oxide, indium zinc oxide including tungsten oxide, indium oxide including titanium oxide, or indium tin oxide including titanium oxide is preferably used.

In order to form the structure where the electric double layer capacitors 105 are connected in series as illustrated in FIG. 1B, the plurality of current collectors 103 is first placed over the substrate 101. The current collector 103 is provided with the active material layers 104 on the first plane and the second plane. In this case, the wirings 106 are also connected to the current collectors 103. Next, the sealant 108 is provided in the periphery of the current collectors 103 provided with the active material layers 104. For the sealant 108, for example, a thermosetting resin may be used. The electrolyte 109 is provided in the region surrounded by the current collectors 103 provided with the active material layers 104 and the sealant 108. The substrate 102 is provided to face the substrate 101 and in contact with the current collectors 103 and the sealant 108. The sealant 108 is cured, so that the structure where the electric double layer capacitors 105 are connected in series is formed. In the above description, the current collectors 103 provided with the active material layers 104 are placed over the substrate 101, and then the sealant 108 is provided; however, the sealant 108 may be provided over the substrate 101, and then the current collectors 103 provided with the active material layers 104 may be placed.

Through the above steps, the structure where electric double layer capacitors each including a region through which light is transmitted are connected in series can be obtained.

Figure 10B:
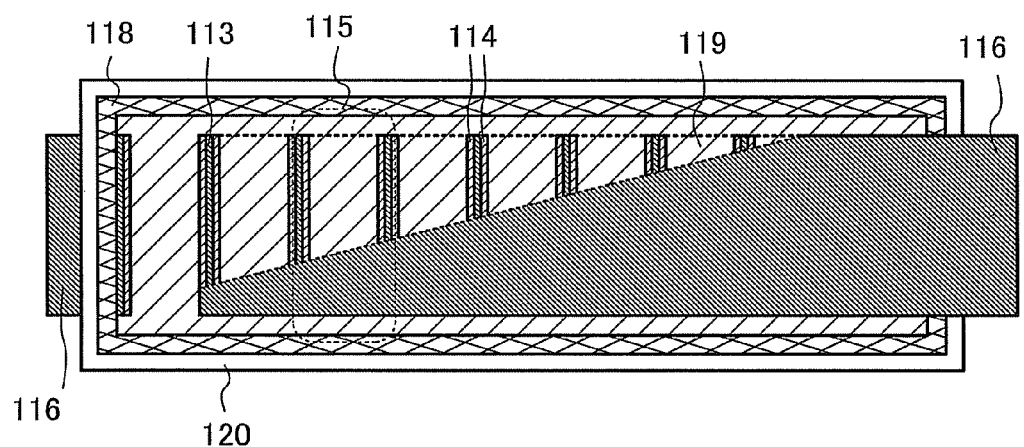

FIG. 1C illustrates a structure where the electric double layer capacitors of this embodiment are connected in parallel. In addition, FIG. 10B is a top view of the electric double layer capacitors 115 connected in parallel in FIG. 1C.

In the structure of FIG. 1C, a plurality of current collectors 113 and a plurality of active material layers 114 are provided between the light-transmitting substrates 101 and 102. The active material layers 114 are provided on a first plane and a second plane which is opposite to the first plane of the current collector 113. Note that the active material layer 114 is provided on only one plane of the current collector 113 provided on the outermost side.

As described above, the substrate 101, the substrate 102, the current collectors 113, and the active material layers 114 are placed so that planes of the substrates 101 and 102, which face each other, and planes of a pair of electrodes (the current collectors 113 and the active material layers 114), which face each other, are perpendicular to each other. Thus, an electrolyte 119 can be provided in a region surrounded by the substrates 101 and 102 which face each other, the active material layer 114 provided on the first plane of the current collector 113, and the active material layer 114 provided on the second plane of the adjacent current collector 113. Note that in the case where the electric double layer capacitors 115 are connected in parallel as illustrated in FIG. 1C, the electrolyte 119 does not need to be divided completely.

The electric double layer capacitor 115 includes adjacent current collectors 113, active material layers 114 provided on planes of the adjacent current collectors 113, which face each other, and the electrolyte 119. Note that the planes of the adjacent current collectors 113, which face each other, can also be referred to as a first plane of an arbitrary current collector 113 and a second plane of a current collector 113 which is adjacent to the arbitrary current collector 113.

Note that in order to connect the electric double layer capacitors 115 in parallel, the plurality of current collectors 113 needs to be connected alternately. Wirings 116 are formed on the substrates 101 and 102 so that the plurality of current collectors 113 is connected alternately. Since the wirings 116 need to transmit light, they are necessarily formed using a light-transmitting conductive material. As such a light-transmitting conductive material, any of the above light-transmitting conductive materials may be used.

The substrate 101, the substrate 102, the current collectors 113, the active material layers 114, and the electrolyte 119 are provided inside a light-transmitting exterior material 120. As the light-transmitting exterior material 120, a material similar to that of the above-described exterior material 110 may be used. Note that the wirings 116 are also placed outside the exterior material 120.

Further, a sealant 118 for preventing leakage of the electrolyte 119 is provided in a region surrounded by the current collectors 113 at the end portions and the exterior material 120.

In order to form the structure where the electric double layer capacitors 115 are connected in parallel as illustrated in FIG. 1C, the wirings 116 are first provided on the substrates 101 and 102. Next, the plurality of current collectors 113 is placed over the wirings 116. The current collector 113 is provided with the active material layers 114 on the first plane and the second plane. In this case, the wirings 116 are also connected to the current collectors 113 over the substrates 101 and 102. Next, the sealant 118 is provided in the periphery of the current collectors 113 provided with the active material layers 114 over the substrate 101 or 102. For the sealant 118, for example, a thermosetting resin may be used. The electrolyte 119 is provided in a region surrounded by the current collectors 113 provided with the active material layers 114 and the sealant 118. The substrate 102 is made to face the substrate 101 and the sealant 118 is cured, so that the structure where the electric double layer capacitors 115 are connected in parallel is formed.

Alternatively, in the case where the electrolyte 119 is an electrolyte solution, an opening is formed in the sealant 118 when the sealant 118 is provided in the periphery of the current collectors 113 provided with the active material layers 114 over the substrate 101 or 102. The substrate 102 is made to face the substrate 101, and the sealant 118 is cured. The electrolyte 119 (electrolyte solution) is injected through the opening of the sealant 118. Another sealant (may be the same material as that of the sealant 118) is provided in the opening of the sealant 118 and cured. Through the above steps, the structure where the electric, double layer capacitors 115 are connected in parallel can be formed.

In the above description, the current collectors 113 provided with the active material layers 114 are placed over the substrate 101, and then the sealant 118 is provided; however, the sealant 118 may be provided over the substrate 101 or 102, and then the current collectors 113 provided with the active material layers 114 may be placed.

Through the above steps, the structure where electric double layer capacitors each including a region through which light is transmitted are connected in parallel can be obtained.

<Lithium Ion Capacitor>

Figure 7A:
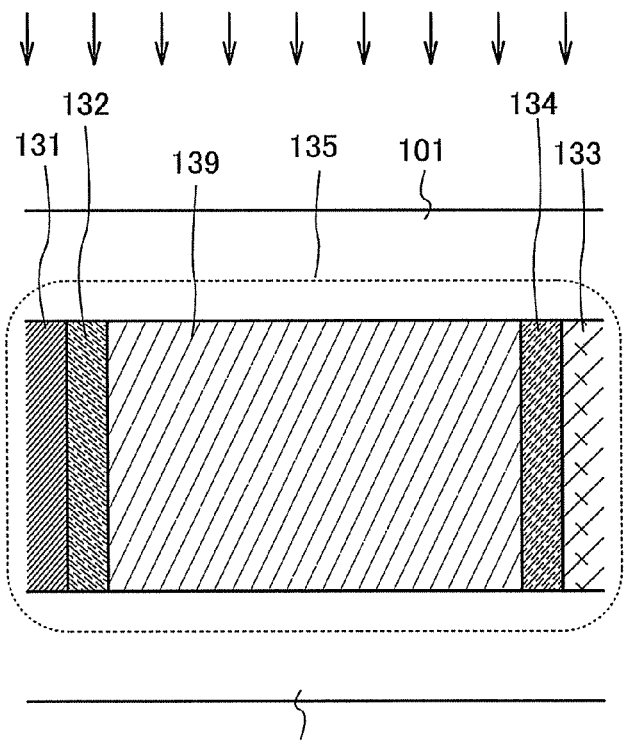
FIGS. 7A to 7C are cross-sectional views each illustrating a lithium ion capacitor.

FIG. 7A illustrates a lithium ion capacitor 135 of this embodiment. The lithium ion capacitor illustrated in FIG. 7A includes a positive electrode current collector 131, a positive electrode active material layer 132, a negative electrode current collector 133, and a negative electrode active material layer 134. The positive electrode active material layer 132 and the negative electrode active material layer 134 are respectively provided on a plane of the positive electrode current collector 131 and a plane of the negative electrode current collector 133, which face each other. In this specification, the positive electrode current collector 131 and the positive electrode active material layer 132 are collectively referred to as a positive electrode, and the negative electrode current collector 133 and the negative electrode active material layer 134 are collectively referred to as a negative electrode.

The lithium ion capacitor 135 transmits light and is provided between the light-transmitting substrates 101 and 102 which face each other. The substrate 101, the substrate 102, the positive electrode (the positive electrode current collector 131 and the positive electrode active material layer 132), and the negative electrode (the negative electrode current collector 133 and the negative electrode active material layer 134) are placed so that planes of the substrates 101 and 102, which face each other, and planes of the positive electrode and the negative electrode, which face each other, are perpendicular to each other. Thus, a light-transmitting electrolyte 139 can be provided in a region surrounded by the substrates 101 and 102 which face each other, the positive electrode active material layer 132, and the negative electrode active material layer 134.

Aluminum, stainless steel, or the like is used for the positive electrode current collector 131. The positive electrode current collector 131 can have a foil shape, a plate shape, a net shape, or the like as appropriate.

The positive electrode active material layer 132 contains a material capable of reversibly occluding carrier ions typified by lithium ions. Typical examples of the material contained in the positive electrode active material layer 132 include active carbon and a polyacenic material.

Stainless steel, copper, nickel, or the like is used for the negative electrode current collector 133. The negative electrode current collector 133 can have a foil shape, a plate shape, a net shape, or the like as appropriate.

The negative electrode active material 144 is formed using a material capable of reversibly occluding lithium ions, a conductive material, and a binder. Typical examples of materials capable of reversibly occluding lithium ions include graphite, non-graphitizable carbon, and a polyacenic material, and the material preferably occludes phosphorus. In addition, a polyacenic material is preferable because capacitance is high. Typical examples of binders include fluoride resins such as polytetrafluoroethylene and polyvinylidene fluoride and thermoplastic resins such as polypropylene and polyethylene. As typical examples of conductive materials, acetylene black, graphite, and metal powder can be given.

The negative electrode active material layer 144 is formed in such a manner that the material capable of occluding and releasing lithium ions is impregnated with metal lithium.

Note that in the case where alkali metal ions other than lithium ions or alkaline earth metal ions are used as carrier ions, the negative electrode active material layer 144 is formed using a material obtained by impregnating a carbon material, a silicon material, a silicon alloy material, or the like with an element to be a raw material of the carrier ions. In this manner, an electrochemical capacitor in which carrier ions are alkali metal ions other than lithium ions or alkaline earth metal ions can be obtained.

The positive electrode current collector 131 and the negative electrode current collector 133 are sandwiched between the substrates 101 and 102 so as to be substantially perpendicular to the substrates and also function as a spacer for maintaining a space between the substrates. Since the positive electrode current collector 131 and the negative electrode current collector 133 function as the spacer, a spacer is not necessarily provided in addition to the positive electrode current collector 131 and the negative electrode current collector 133. Therefore, manufacturing cost can be reduced, which is preferable.

The thicknesses of the positive electrode current collector 131, the positive electrode active material layer 132, the negative electrode current collector 133, and the negative electrode active material layer 134 are reduced as much as possible so that they do not prevent incident light. Since the positive electrode current collector 131 and the negative electrode current collector 133 function as the spacer for maintaining the space between the substrates 101 and 102, the positive electrode current collector 131 and the negative electrode current collector 133 have a thickness with which they can function as the spacer and with which incident light can be prevented as little as possible.

In the case where a liquid electrolyte, that is, an electrolyte solution, is used as the light-transmitting electrolyte 139, a material in which transport of lithium ions serving as carrier ions is possible and the lithium ions stably exist is used as a solute of the electrolyte solution. As such a material, a material including a lithium salt, such as $LiClO_4$, $LiAsF_6$, $LiBF_4$, $LiPF_6$, or $Li(C_2F_5SO_2)_2N$ can be used, for example. In addition, in the case where carrier ions are alkali metal ions other than lithium ions or alkaline earth metal ions, it is possible to use any of the following as the solute of the electrolyte solution: alkali metal salts such as sodium salts and potassium salts; and alkaline earth metal salts such as calcium salts, strontium salts, and barium salts. Alternatively, beryllium salts or magnesium salts can be used as the solute of the electrolyte solution.

As a solvent of the electrolyte solution, a material in which transport of carrier ions is possible can be used, and an aprotic organic solvent is preferably used. Examples of the aprotic organic solvent are ethylene carbonate, propylene carbonate, dimethyl carbonate, diethyl carbonate, γ-butyrolactone, acetonitrile, dimethoxyethane, tetrahydrofuran, and the like. As the solvent of the electrolyte solution, one or more materials can be used. When a gelled high molecular material is used as the solvent of the electrolyte solution, safety against liquid leakage is increased, and the electrochemical capacitor of this embodiment can be thin and lightweight. Examples of the gelled high molecular material are silicon gels, acrylic gels, acrylonitrile gels, polyethylene oxides, polypropylene oxides, fluorine-based polymers, and the like.

In the case where a light-transmitting electrolyte solution which is a liquid electrolyte is used as the electrolyte 139 as described above, a separator is provided between the positive electrode and the negative electrode and the inside of the separator is impregnated with the electrolyte solution. In the case where the inside of the separator is impregnated with the electrolyte solution, a light-transmitting material is also used for the separator.

In FIG. 7A, arrows show a light incident direction. The positive electrode current collector 131, the positive electrode active material layer 132, the negative electrode current collector 133, and the negative electrode active material layer 134 of the lithium ion capacitor 135 in FIG. 7A are provided perpendicularly to the light incident direction. Therefore, the positive electrode current collector 131, the positive electrode active material layer 132, the negative electrode current collector 133, and the negative electrode active material layer 134 prevent transmission of incident light as less as possible, which is preferable. In the lithium ion capacitor 135 of this embodiment, a region not provided with the positive electrode current collector 131, the positive electrode active material layer 132, the negative electrode current collector 133, and the negative electrode active material layer 134 is a region through which light is transmitted. Thus, as described above, the thicknesses of the positive electrode current collector 131, the positive electrode active material layer 132, the negative electrode current collector 133, and the negative electrode active material layer 134 are reduced as much as possible so that they do not prevent incident light.

Figure 7B:
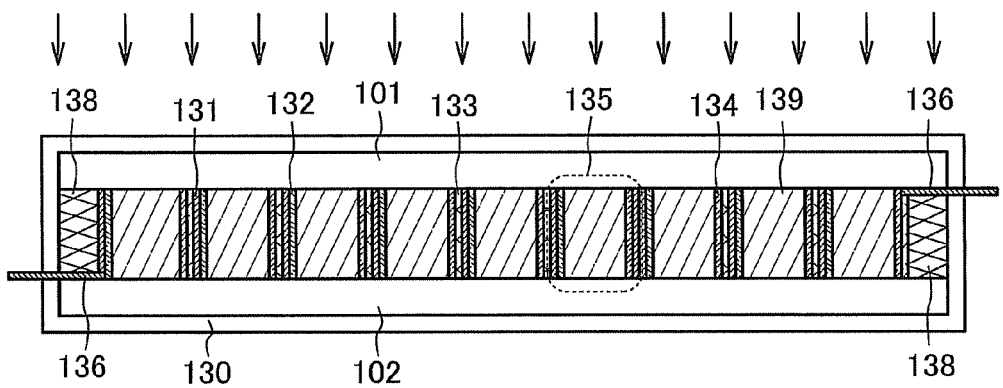
Figure 7C:
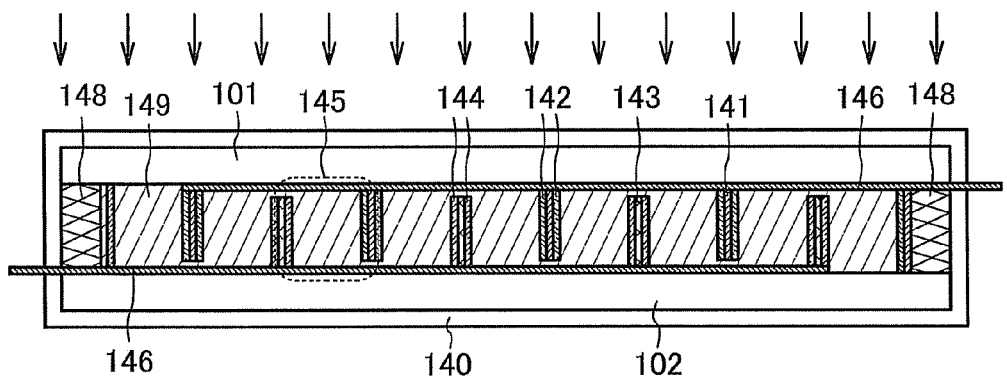
Figure 11A:
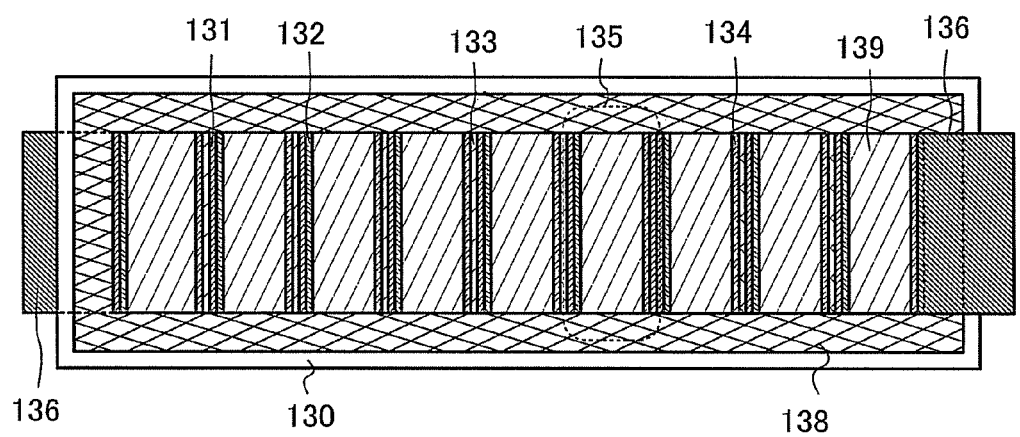
FIGS. 11A and 11B are top views each illustrating a lithium ion capacitor.

FIG. 7B illustrates a structure in which a plurality of lithium ion capacitors 135 in FIG. 7A is connected in series. In addition, FIG. 11A is a top view of the lithium ion capacitors 135 connected in series in FIG. 7B. A predetermined voltage can be obtained in the following manner: the plurality of lithium ion capacitors 135 is connected in series as illustrated in FIG. 7B or a plurality of lithium ion capacitors 135 is connected in parallel as illustrated in FIG. 7C, which is described later.

In the structure of FIG. 7B, the plurality of lithium ion capacitors 135 is connected in series between the light-transmitting substrates 101 and 102.

In the structure of FIG. 7B, a plurality of positive electrode current collectors 131 and a plurality of positive electrode active material layers 132 are provided between the light-transmitting substrates 101 and 102. The positive electrode active material layers 132 are provided on a first plane and a second plane which is opposite to the first plane of the positive electrode current collector 131. In a similar manner, a plurality of negative electrode current collectors 133 and a plurality of negative electrode active material layers 134 are provided between the light-transmitting substrates 101 and 102. The negative electrode active material layers 134 are provided on a first plane and a second plane which is opposite to the first plane of the negative electrode current collector 143.

As described above, the substrate 101, the substrate 102, the positive electrodes (the positive electrode current collectors 131 and the positive electrode active material layers 132), and the negative electrodes (the negative electrode current collectors 133 and the negative electrode active material layers 134) are provided so that planes of the substrates 101 and 102, which face each other, and planes of the positive electrodes and the negative electrodes, which face each other, are perpendicular to each other. Thus, the electrolyte 139 can be provided in a region surrounded by the substrate 101, the substrate 102, the positive electrode active material layer 132, and the negative electrode active material layer 134.

The positive electrode current collector 131 of the lithium ion capacitor 135 is connected to the negative electrode current collector 133 of one adjacent lithium ion capacitor 135. The negative electrode current collector 133 of the lithium ion capacitor 135 is connected to the positive electrode current collector 131 of another adjacent lithium ion capacitor 135. In this manner, the plurality of lithium ion capacitors 135 can be connected in series.

Note that when the lithium ion capacitors 135 are connected in series as illustrated in FIG. 7B, it is necessary that the positive electrodes and the negative electrodes are completely separated from each other and the electrolyte 139 is divided for each lithium ion capacitor 135. When the electrolyte 139 is not divided for each lithium ion capacitor 135, the lithium ion capacitors 135 cannot be connected in series.

Therefore, in the case where the lithium ion capacitors 135 are connected in series as illustrated in FIG. 7B, when the cross-sectional view thereof is seen, the electrolyte 139 is provided in a region surrounded by the substrate 101, the substrate 102, the positive electrode active material layer 132 provided on the positive electrode current collector 131, and the negative electrode active material layer 134 provided on the negative electrode current collector 133 and facing the positive electrode active material layer 132. Further, when a plan view is seen (see FIG. 11A), the electrolyte 139 is provided in a region surrounded by the positive electrode active material layer 132 provided on the positive electrode current collector 131, the negative electrode active material layer 134 provided on the negative electrode current collector 133, and a sealant 138.

The substrate 101, the substrate 102, the positive electrodes, the negative electrodes, and the electrolyte 139 are provided inside a light-transmitting exterior material 130. As the light-transmitting exterior material 130, like the exterior material 110, a light-transmitting laminate film, a light-transmitting high molecular film, a light-transmitting plastic case, or the like can be used.

Of the plurality of lithium ion capacitors 135, two lithium ion capacitors 135 are provided on opposite outermost sides. A wiring 136 is connected to the positive electrode current collector 131 of one of the lithium ion capacitors 135 provided on the outermost sides and is placed outside the exterior material 130. Another wiring 136 is connected to the negative electrode current collector 133 of the other of the lithium ion capacitors 135 provided on the outermost sides and is placed outside the exterior material 130. The sealant 138 for preventing leakage of the electrolyte 139 is provided in a region surrounded by the exterior material 130, the positive electrode current collector 131 of the one of the lithium ion capacitors 135 provided on the outermost sides, and the negative electrode current collector 133 of the other of the lithium ion capacitors 135 provided on the outermost sides.

In the structure where the lithium ion capacitors 135 are connected in series as illustrated in FIG. 7B, the wirings 136 provided outside the exterior material 130 are provided only in the positive electrode current collector 131 of the one of the lithium ion capacitors 135 provided on the outermost sides and the negative electrode current collector 133 of the other of the lithium ion capacitors 135 provided on the outermost sides. The wirings 136 are preferably formed using a light-transmitting conductive material; however, in the case where the distance between the positive electrode current collector 131 of the one of the lithium ion capacitors 135 provided on the outermost sides and an end portion of the substrate 101 (or the substrate 102) and the distance between the negative electrode current collector 133 of the other of the lithium ion capacitors 135 provided on the outermost sides and another end portion of the substrate 101 (or the substrate 102) are short, a non-light-transmitting conductive material may be used as a material of the wirings 136. As the material of the wirings 136, a material similar to that of the wirings 106 may be used.

In order to form the structure where the lithium ion capacitors 135 are connected in series as illustrated in FIG. 7B, the plurality of positive electrode current collectors 131 and the plurality of negative electrode current collectors 133 are first provided over the substrate 101. The positive electrode active material layer 132 is provided on one plane of the positive electrode current collector 131. The negative electrode active material layer 134 is provided on one plane of the negative electrode current collector 133. In this case, the positive electrode current collectors 131 provided with the positive electrode active material layers 132 and the negative electrode current collectors 133 provided with the negative electrode active material layers 134 are provided alternately and provided so that the other planes of the positive current collectors are in contact with the other planes of the negative electrode current collectors which are adjacent to the positive electrode current collectors. In addition, the wirings 136 are connected to the positive electrode current collector 131 on the one outermost side and the negative electrode current collector 133 on the other outermost side. Next, the sealant 138 is provided in the periphery of the positive electrode current collectors 131 provided with the positive electrode active material layers 132 and the negative electrode current collectors 133 provided with the negative electrode active material layers 134, which are provided alternately. For the sealant 138, for example, a thermosetting resin may be used. The electrolyte 139 is provided in a region surrounded by the positive electrode current collector 131 provided with the positive electrode active material layer 132, the negative electrode current collector 133 provided with the negative electrode active material layer 134, and the sealant 138. The substrate 102 is provided to face the substrate 101 and in contact with the positive electrode current collectors 131, the negative electrode current collectors 133, and the sealant 138. The sealant 138 is cured, so that the structure where the lithium ion capacitors 135 are connected in series is formed. In the above description, the positive electrode current collectors 131 provided with the positive electrode active material layers 132 and the negative electrode current collectors 133 provided with the negative electrode active material layers 134 are placed over the substrate 101, and then the sealant 138 is provided; however, the sealant 138 may be provided over the substrate 101, and then the positive electrode current collectors 131 provided with the positive electrode active material layers 132 and the negative electrode current collectors 133 provided with the negative electrode active material layers 134 may be placed.

Through the above steps, the structure where lithium ion capacitors each including a region through which light is transmitted are connected in series can be obtained.

Figure 11B:
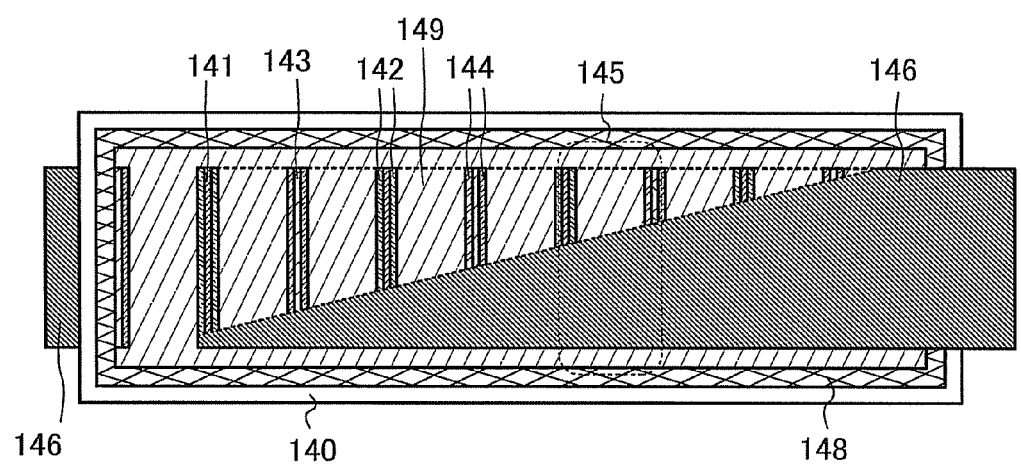

FIG. 7C illustrates a structure where the lithium ion capacitors of this embodiment are connected in parallel. In addition, FIG. 11B is a top view of the lithium ion capacitors connected in parallel in FIG. 7C.

In the structure of FIG. 7C, a plurality of positive electrode current collectors 141 and a plurality of positive electrode active material layers 142 are provided between the light-transmitting substrates 101 and 102. The positive electrode active material layers 142 are provided on a first plane and a second plane which is opposite to the first plane of the positive electrode current collector 141. In a similar manner, a plurality of negative electrode current collectors 143 and a plurality of negative electrode active material layers 144 are provided between the light-transmitting substrates 101 and 102. The negative electrode active material layers 144 are provided on a first plane and a second plane which is opposite to the first plane of the negative electrode current collector 143.

As described above, the substrate 101, the substrate 102, positive electrodes (the positive electrode current collectors 141 and the positive electrode active material layers 142), and negative electrodes (the negative electrode current collectors 143 and the negative electrode active material layers 144) are provided so that planes of the substrates 101 and 102, which face each other, and planes of the positive electrodes and the negative electrodes, which face each other, are perpendicular to each other. Thus, an electrolyte 149 can be provided in a region surrounded by the substrates 101 and 102, the positive electrode active material layer 142, and the negative electrode active material layer 144. Note that in the case where the lithium ion capacitors 145 are connected in parallel as illustrated in FIG. 7C, the electrolyte 149 does not need to be divided completely.

Note that in order to connect the lithium ion capacitors 145 in parallel, a wiring 146 electrically connected to the plurality of positive electrode current collectors 141 and a wiring 146 electrically connected to the plurality of negative electrode current collectors 143 are formed over the substrate 101 and the substrate 102, respectively. Since the wirings 146 need to transmit light, they are necessarily formed using a light-transmitting conductive material. As such a light-transmitting conductive material, any of the above light-transmitting conductive materials may be used.

The substrate 101, the substrate 102, the positive electrodes, the negative electrodes, and the electrolyte 149 are provided inside a light-transmitting exterior material 140. As the light-transmitting exterior material 140, a material similar to that of the above-described exterior material 110 may be used. Note that the wirings 146 are also placed outside the exterior material 140.

Further, a sealant 148 for preventing leakage of the electrolyte 149 is provided in a region surrounded by the positive electrode current collector 141 at the one end portion, the negative electrode current collector 143 at the other end portion, and the exterior material 140.

In order to form the structure where the lithium ion capacitors 145 are connected in parallel as illustrated in FIG. 7C, the wirings 146 are first provided over the substrate 101 and the substrate 102. Next, the plurality of positive electrode current collectors 141 and the plurality of negative electrode current collectors 143 are placed over the wirings 146. The positive current collector 141 is provided with the positive electrode active material layers 142 on the first plane and the second plane. The negative current collector 143 is provided with the negative electrode active material layers 144 on the first plane and the second plane. In this case, the positive electrode current collectors 141 provided with the positive electrode active material layers 142 and the negative electrode current collectors 143 provided with the negative electrode active material layers 144 are provided alternately when the substrate 101 and the substrate 102 are made to face each other. In addition, the wirings 146 are connected to the positive electrode current collectors 131 and the negative electrode current collectors 143 over the substrates 101 and 102. Next, the sealant 148 is provided in the periphery of the positive electrode current collectors 141 provided with the positive electrode active material layers 142 and the negative electrode current collectors 143 provided with the negative electrode active material layers 144 over the substrate 101 and the substrate 102. For the sealant 148, for example, a thermosetting resin may be used. The electrolyte 149 is provided in a region surrounded by the positive electrode current collector 141 provided with the positive electrode active material layer 142, the negative electrode current collector 143 provided with the negative electrode active material layer 144, and the sealant 148. The substrate 102 is made to face the substrate 101 and the sealant 148 is cured, so that the structure where the lithium ion capacitors 145 are connected in parallel is formed.

Alternatively, in the case where the electrolyte 149 is an electrolyte solution, an opening is formed in the sealant 148 when the sealant 148 is provided in the periphery of the positive electrode current collectors 141 provided with the positive electrode active material layers 142 and the negative electrode current collectors 143 provided with the negative electrode active material layers 144. The substrate 102 is made to face the substrate 101, and the sealant 148 is cured. The electrolyte 149 (electrolyte solution) is injected through the opening of the sealant 148. Another sealant (may be the same material as the sealant 148) is provided in the opening of the sealant 148 and cured. Through the above steps, the structure where the lithium ion capacitors 145 are connected in parallel can be formed.

In the above description, the positive electrode current collectors 141 provided with the positive electrode active material layers 142 and the negative electrode current collectors 143 provided with the negative electrode active material layers 144 are placed over the substrates 101 and 102, and then the sealant 148 is provided; however, the sealant 148 may be provided over the substrate 101 or 102, and then the positive electrode current collectors 141 provided with the positive electrode active material layers 142 and the negative electrode current collectors 143 provided with the negative electrode active material layers 144 may be placed.

Through the above steps, the structure where lithium ion capacitors each including a region through which light is transmitted are connected in parallel can be obtained.

<Charging Device>

Figure 2:
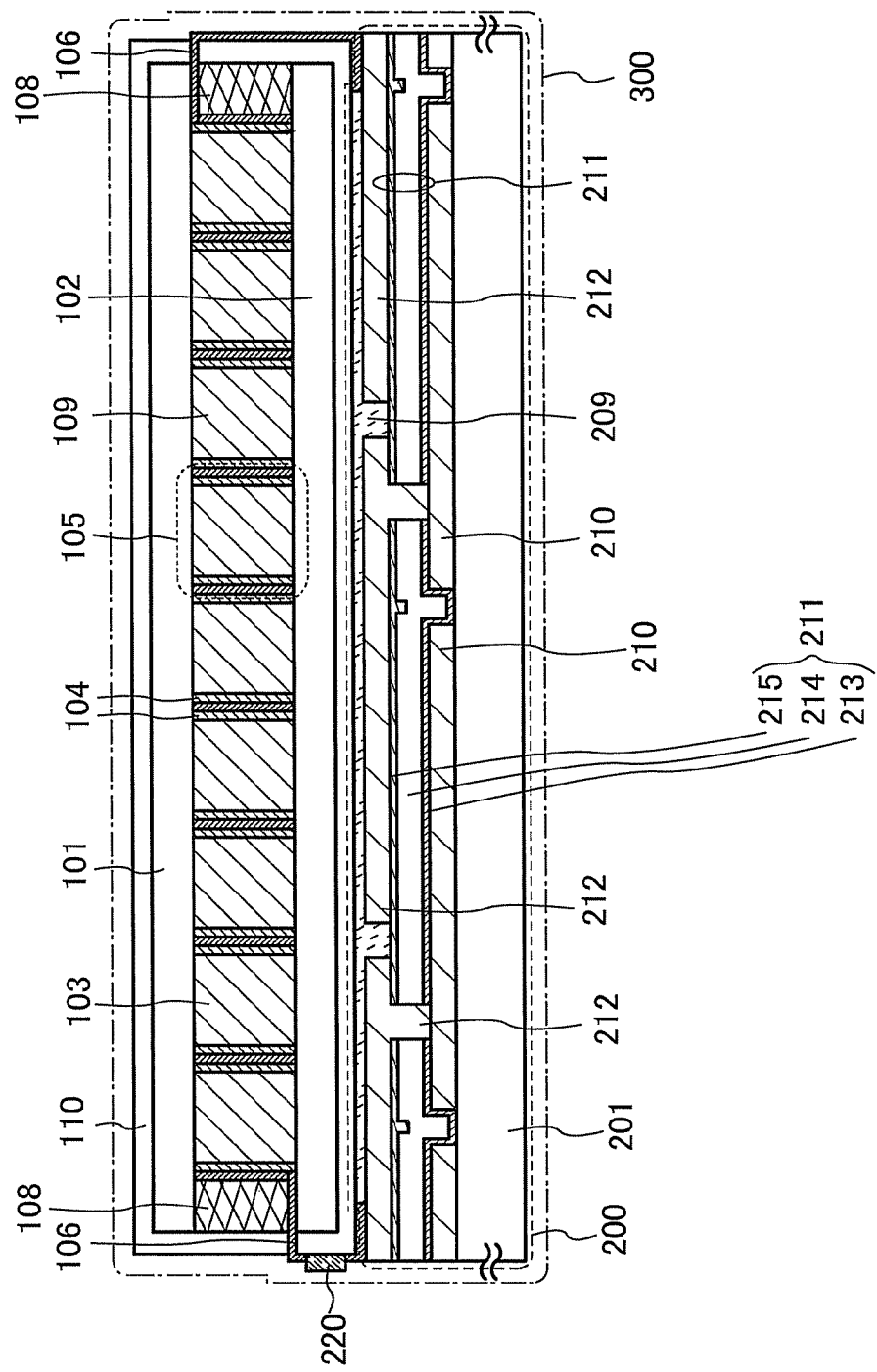
FIG. 2 is a cross-sectional view illustrating a charging device in which a solar cell and an electric double layer capacitor are overlapped with each other.

FIG. 2 illustrates an example of a charging device in which the electric double layer capacitors 105 connected in series in FIG. 1B and a solar cell are overlapped with each other.

A solar cell 200 illustrated in FIG. 2 includes, over a light-transmitting substrate 201, a light-transmitting conductive film 210; a photoelectric conversion layer 211 which is provided in contact with the light-transmitting conductive film 210; and a light-transmitting conductive film 212 which is provided in contact with the photoelectric conversion layer 211.

For example, a glass plate of general flat glass, clear flat glass, lead glass, tempered glass, ceramic glass, or the like can be used as the light-transmitting substrate 201. Further, a non-alkali glass substrate of aluminosilicate glass, barium borosilicate glass, aluminoborosilicate glass, or the like; a quartz substrate; or a ceramic substrate can be used.

There is a tendency that a flexible substrate formed using a synthetic resin (e.g., a plastic substrate) generally has a lower allowable temperature limit than the above substrates when the flexible substrate is used as the light-transmitting substrate 201. However, such a substrate can be used as long as it can withstand processing temperature in manufacturing steps.

As a plastic substrate, polyester; polyethersulfone (PES); polyethylene naphthalate (PEN); polycarbonate (PC); a polyimide synthetic fiber; polyetheretherketone (PEEK); polysulfone (PSF); polyetherimide (PEI); polyarylate (PAR); polybutylene terephthalate (PBT); polyimide; an acrylonitrile butadiene styrene resin; polyvinyl chloride; polypropylene; polyvinyl acetate; an acrylic resin; and the like can be given. Polyethylene terephthalate (PET), can be given as polyester, for example.

The light-transmitting conductive films 210 and 212 may be formed using any of the light-transmitting conductive materials described above.

The photoelectric conversion layer 211 is a stacked-layer film in which a p-type semiconductor layer, an intrinsic semiconductor layer, and an n-type semiconductor layer are stacked in this order or a stacked-layer film in which an n-type semiconductor layer, an intrinsic semiconductor layer, and a p-type semiconductor layer are stacked in this order. The p-type semiconductor layer, the intrinsic semiconductor layer, and the n-type semiconductor layer can each be formed using an amorphous semiconductor layer, a polycrystalline semiconductor layer, a microcrystalline semiconductor layer, or the like. In this embodiment, as the photoelectric conversion layer 211, a stacked-layer film in which a p-type semiconductor layer 213, an intrinsic semiconductor layer 214, and an n-type semiconductor layer 215 are stacked in this order is used.

The conductive film 212 and one photoelectric conversion layer 211 are electrically connected to each other on the n-type semiconductor layer 215 side. In addition, the conductive film 210 and the one photoelectric conversion layer 211 are electrically connected to each other on the p-type semiconductor layer 213 side. The conductive film 210 is electrically connected to the conductive film 212 of the photoelectric conversion layer 211 which is different from the one photoelectric conversion layer 211. Thus, each cell is electrically connected to a different cell. Each cell is connected to a different cell in series, so that output voltage can be increased.

The conductive film 212 of a cell at one end of the solar cell 200 and the conductive film 212 of a cell at another end of the solar cell 200 are electrically connected to the wirings 106 which are electrically connected to the electric double layer capacitors 105. Note that in the case where the wirings 106 are formed using a non-light-transmitting material, the wirings 106 are placed so as not to block regions of the solar cell 200 and the electric double layer capacitors 105 through which light is transmitted. A diode 220 is provided between the solar cell 200 and the electric double layer capacitors 105 so that electric power stored in the electric double layer capacitors 105 is not discharged to the solar cell 200. In order to provide the diode 220 between the solar cell 200 and the electric double layer capacitors 105, an input terminal and an output terminal of the diode 220 may be electrically connected to the corresponding wirings 106.

Thus, electric power generated by the solar cell 200 is stored in the electric double layer capacitor 105 through the conductive film 210, the conductive film 212, and the wiring 106. Another electronic device can be charged using electric power which is generated by the solar cell 200 and stored in the electric double layer capacitor 105.

A space between the exterior material 110 and the wiring 106 for the electric double layer capacitor 105, and the conductive film 212 and the photoelectric conversion layer 211 of the solar cell 200 is filled with a light-transmitting adhesive 209. The electric double layer capacitors 105 and the solar cell 200 adhere to each other with the light-transmitting adhesive 209.

Thus, a charging device 300 in which the electric double layer capacitors 105 and the solar cell 200 are overlapped with each other can be obtained. The solar cell 200 and the electric double layer capacitors 105 each have a region through which light is transmitted; therefore, the charging device 300 also has a region through which light is transmitted. The electric double layer capacitors 105 and the solar cell 200 are overlapped with each other as described above, whereby an increase in the area occupied by the electric double layer capacitors 105 and the solar cell 200 can be suppressed.

Figure 3:
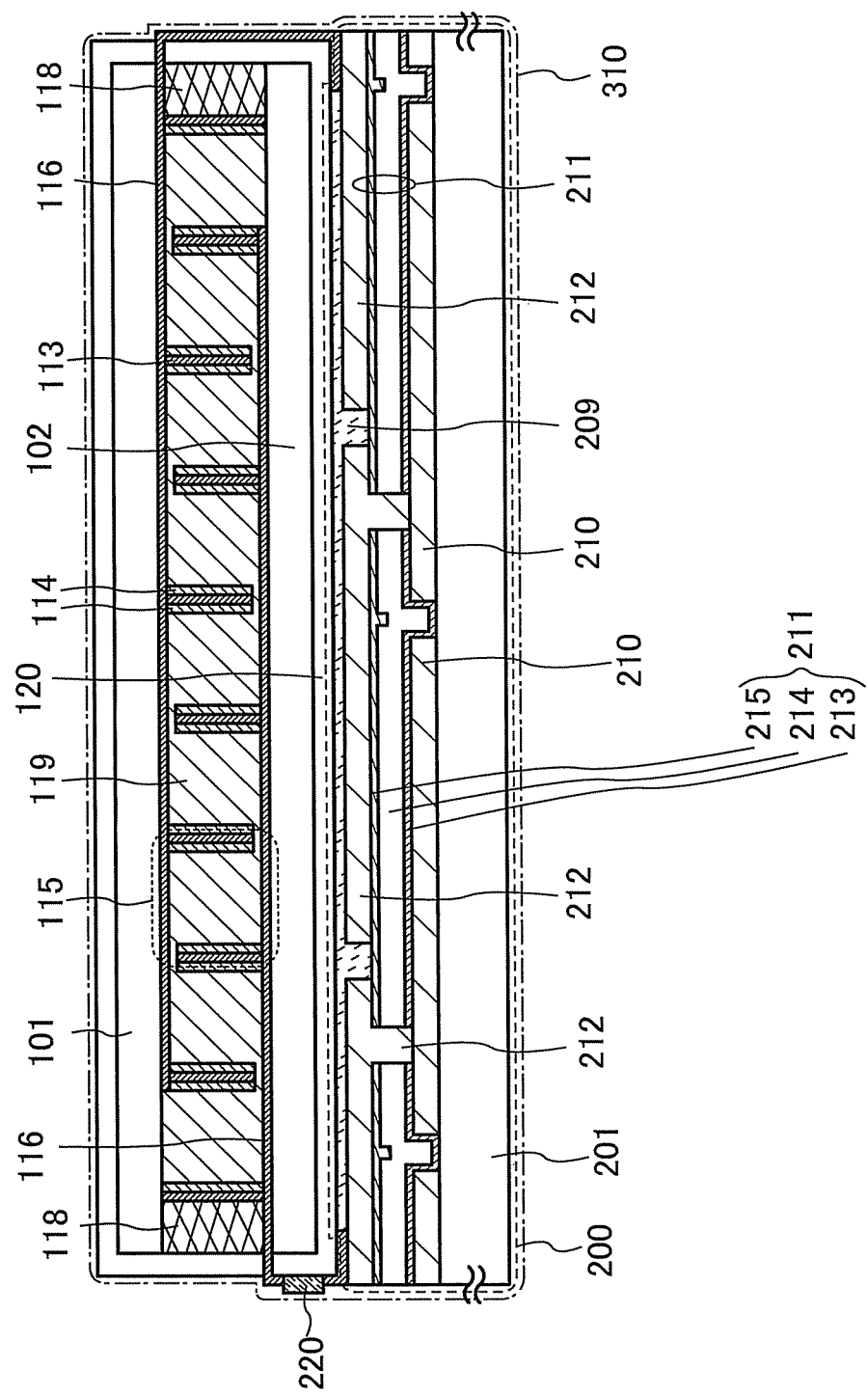
FIG. 3 is a cross-sectional view illustrating a charging device in which a solar cell and an electric double layer capacitor are overlapped with each other.

FIG. 3 illustrates an example of a charging device in which the electric double layer capacitors 115 connected in parallel in FIG. 1C and the solar cell 200 are overlapped with each other.

The conductive film 212 of a cell at one end of the solar cell 200 and the conductive film 212 of a cell at another end of the solar cell 200 are electrically connected to the wirings 116 which are electrically connected to the electric double layer capacitors 115. Note that in the case where the wirings 116 are formed using a non-light-transmitting material, the wirings 116 are placed so as not to block regions of the solar cell 200 and the electric double layer capacitors 115 through which light is transmitted. The diode 220 is provided between the solar cell 200 and the electric double layer capacitors 115 so that electric power stored in the electric double layer capacitors 115 is not discharged to the solar cell 200. In order to provide the diode 220 between the solar cell 200 and the electric double layer capacitors 115, the input terminal and the output terminal of the diode 220 may be electrically connected to the corresponding wirings 116.

Thus, electric power generated by the solar cell 200 is stored in the electric double layer capacitor 115 through the conductive film 210, the conductive film 212, and the wiring 116. Another electronic device can be charged using electric power which is generated by the solar cell 200 and stored in the electric double layer capacitor 115.

A space between the exterior material 120 and the wiring 116 for the electric double layer capacitor 115, and the conductive film 212 and the photoelectric conversion layer 211 of the solar cell 200 is filled with the light-transmitting adhesive 209. The electric double layer capacitors 115 and the solar cell 200 adhere to each other with the light-transmitting adhesive 209.

Thus, a charging device 310 in which the electric double layer capacitors 115 and the solar cell 200 are overlapped with each other can be obtained. The solar cell 200 and the electric double layer capacitors 115 each have a region through which light is transmitted; therefore, the charging device 310 also has a region through which light is transmitted. The electric double layer capacitors 115 and the solar cell 200 are overlapped with each other as described above, whereby an increase in the area occupied by the electric double layer capacitors 115 and the solar cell 200 can be suppressed.

FIG. 8 illustrates an example of a charging device in which the lithium ion capacitors 135 connected in series in FIG. 7B and the solar cell are overlapped with each other.

The conductive film 212 of a cell at one end of the solar cell 200 and the conductive film 212 of a cell at another end of the solar cell 200 are electrically connected to the wirings 136 which are electrically connected to the lithium ion capacitors 135. Note that in the case where the wirings 136 are formed using a non-light-transmitting material, the wirings 136 are placed so as not to block regions of the solar cell 200 and the lithium ion capacitors 135 through which light is transmitted. The diode 220 is provided between the solar cell 200 and the lithium ion capacitors 135 so that electric power stored in the lithium ion capacitors 135 is not discharged to the solar cell 200. In order to provide the diode 220 between the solar cell 200 and the lithium ion capacitors 135, the input terminal and the output terminal of the diode 220 may be electrically connected to the corresponding wirings 136.

Thus, electric power generated by the solar cell 200 is stored in the lithium ion capacitor 135 through the conductive film 210, the conductive film 212, and the wiring 136. Another electronic device can be charged using electric power which is generated by the solar cell 200 and stored in the lithium ion capacitor 135.

A space between the exterior material 130 and the wiring 136 for the lithium ion capacitor 135, and the conductive film 212 and the photoelectric conversion layer 211 of the solar cell 200 is filled with the light-transmitting adhesive 209. The lithium ion capacitors 135 and the solar cell 200 adhere to each other with the light-transmitting adhesive 209.

Thus, a charging device 330 in which the lithium ion capacitors 135 and the solar cell 200 are overlapped with each other can be obtained. The solar cell 200 and the lithium ion capacitors 135 each have a region through which light is transmitted; therefore, the charging device 330 also has a region through which light is transmitted. The lithium ion capacitors 135 and the solar cell 200 are overlapped with each other as described above, whereby an increase in the area occupied by the lithium ion capacitors 135 and the solar cell 200 can be suppressed.

Figure 9:
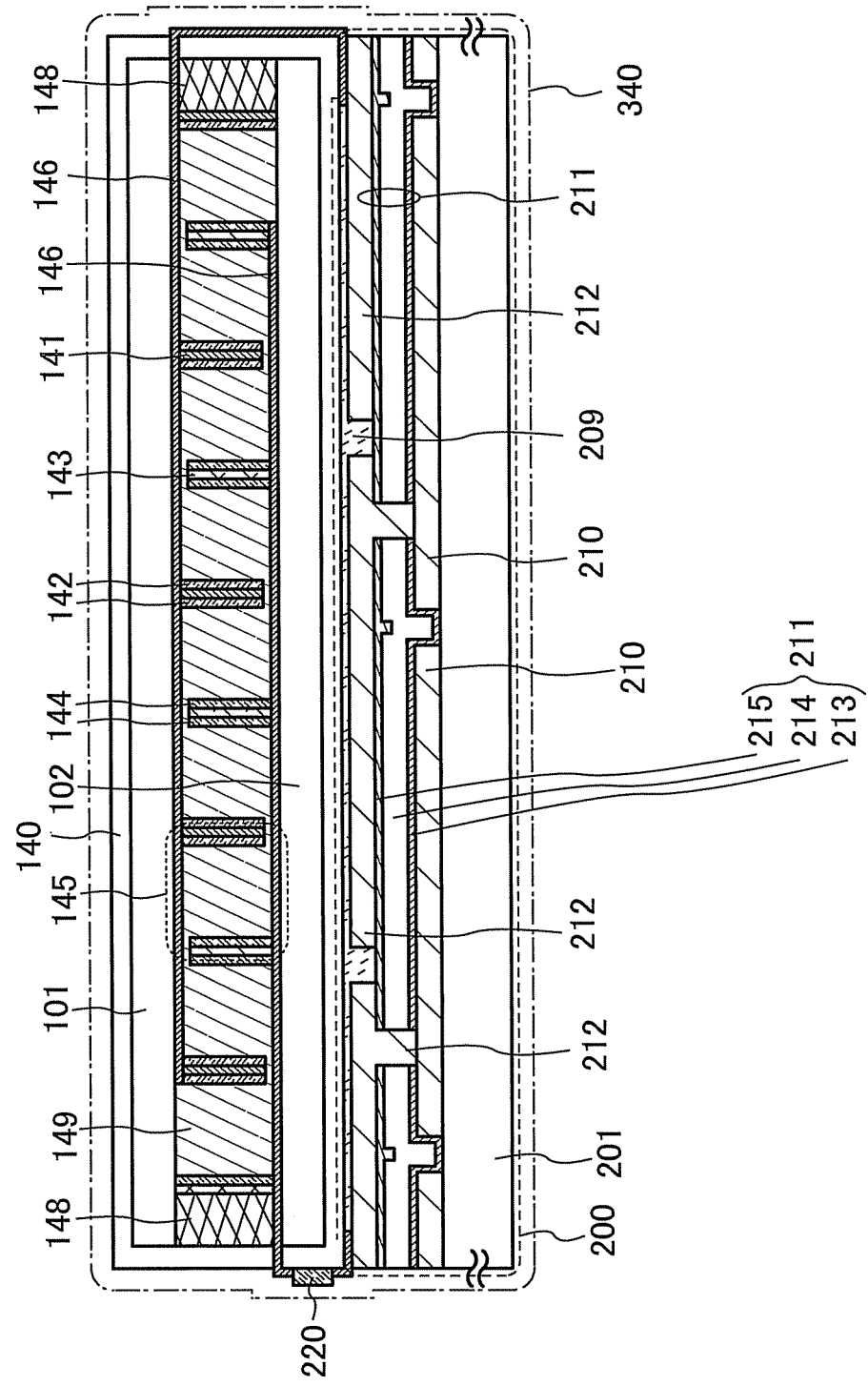
FIG. 9 is a cross-sectional view illustrating a charging device in which a solar cell and a lithium ion capacitor are overlapped with each other.

FIG. 9 illustrates an example of a charging device in which the lithium ion capacitors 145 connected in parallel in FIG. 7C and the solar cell are overlapped with each other.

The conductive film 212 of a cell at one end of the solar cell 200 and the conductive film 212 of a cell at another end of the solar cell 200 are electrically connected to the wirings 146 which are electrically connected to the lithium ion capacitors 145. Note that in the case where the wirings 146 are formed using a non-light-transmitting material, the wirings 146 are placed so as not to block regions of the solar cell 200 and the lithium ion capacitors 145 through which light is transmitted. The diode 220 is provided between the solar cell 200 and the lithium ion capacitors 145 so that electric power stored in the lithium ion capacitors 145 is not discharged to the solar cell 200. In order to provide the diode 220 between the solar cell 200 and the lithium ion capacitors 145, the input terminal and the output terminal of the diode 220 may be electrically connected to the corresponding wirings 146.

Thus, electric power generated by the solar cell 200 is stored in the lithium ion capacitor 145 through the conductive film 210, the conductive film 212, and the wiring 146. Another electronic device can be charged using electric power which is generated by the solar cell 200 and stored in the lithium ion capacitor 145.

A space between the exterior material 140 and the wiring 146 for the lithium ion capacitor 145, and the conductive film 212 and the photoelectric conversion layer 211 of the solar cell 200 is filled with the light-transmitting adhesive 209. The lithium ion capacitors 145 and the solar cell 200 adhere to each other with the light-transmitting adhesive 209.

Thus, a charging device 340 in which the lithium ion capacitors 145 and the solar cell 200 are overlapped with each other can be obtained. The solar cell 200 and the lithium ion capacitors 145 each have a region through which light is transmitted; therefore, the charging device 340 also has a region through which light is transmitted. The lithium ion capacitors 145 and the solar cell 200 are overlapped with each other as described above, whereby an increase in the area occupied by the lithium ion capacitors 145 and the solar cell 200 can be suppressed.

<Application Example of Charging Device>

Figure 4A:
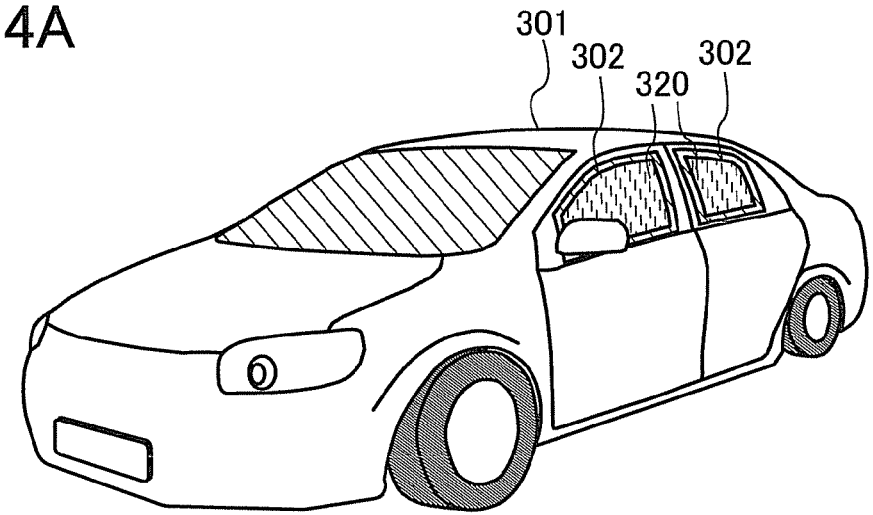
FIG. 4A is a view illustrating an example in which a window of an electric vehicle is provided with a charging device and FIG. 4B is a view illustrating an example in which a roof of an electric vehicle is provided with a charging device.

FIG. 4A is a perspective view of an electric vehicle 301. In FIG. 4A, a side window 302 of the electric vehicle 301 is provided with a charging device 320 including a region through which light is transmitted. As the charging device 320 in FIG. 4A, the charging device 300, the charging device 310, the charging device 330, or the charging device 340 can be used.

Figure 4B:
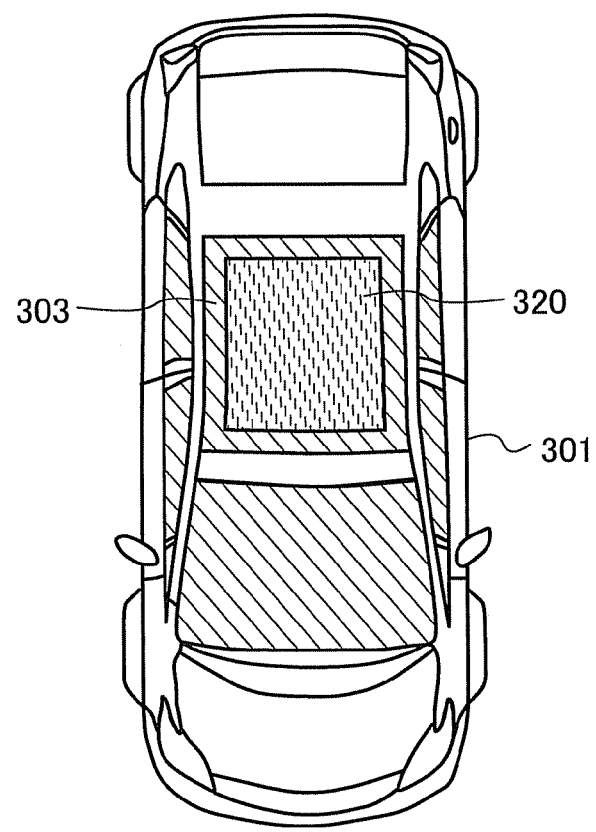

FIG. 4B is a top view of the electric vehicle 301. In FIG. 4B, a roof 303 of the electric vehicle 301 is provided with the charging device 320 including a region through which light is transmitted. As the charging device 320 in FIG. 4B, the charging device 300, the charging device 310, the charging device 330, or the charging device 340 can be used.

As illustrated in FIGS. 4A and 4B, the side window 302, the roof 303, or both the side window 302 and the roof 303 of the electric vehicle 301 can be provided with the charging device 320 including a region through which light is transmitted.

When the side window 302 or the roof 303 which has a curved surface is provided with the charging devices 320 of this embodiment as illustrated in FIG. 4A or 4B, a flexible light-transmitting substrate is used as substrates of a power storage device (an electric double layer capacitor or a lithium ion capacitor) and a solar cell.

Electric power generated and stored in the charging device 320 can be used for motive power of the electric vehicle 301, power source of a light of the electric vehicle 301, or the like.

Figure 5:
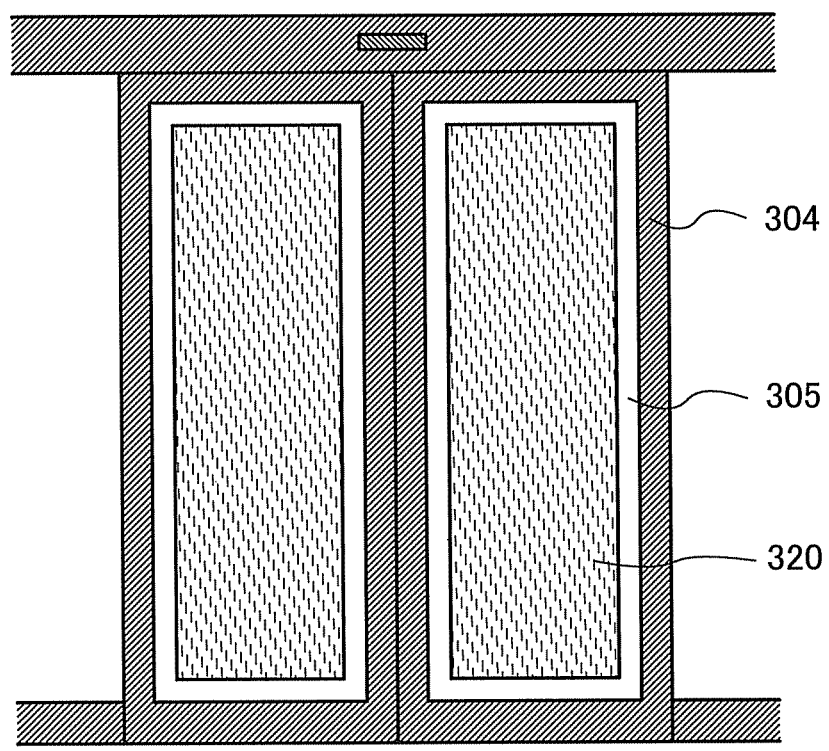
FIG. 5 is a view illustrating an example in which a door board of an automatic door is provided with a charging device.

FIG. 5 illustrates an example in which a door board of an automatic door is provided with the charging device 320 including a region through which light is transmitted.

FIG. 5 is a front view of an automatic door 304. In FIG. 5, a door board 305 of the automatic door 304 is provided with the charging device 320 including a region through which light is transmitted. As the charging device 320 in FIG. 5, the charging device 300, the charging device 310, the charging device 330, or the charging device 340 can be used.

Electric power generated and stored in the charging device 320 can be used for motive power of the automatic door 304, or the like.

Figure 6:
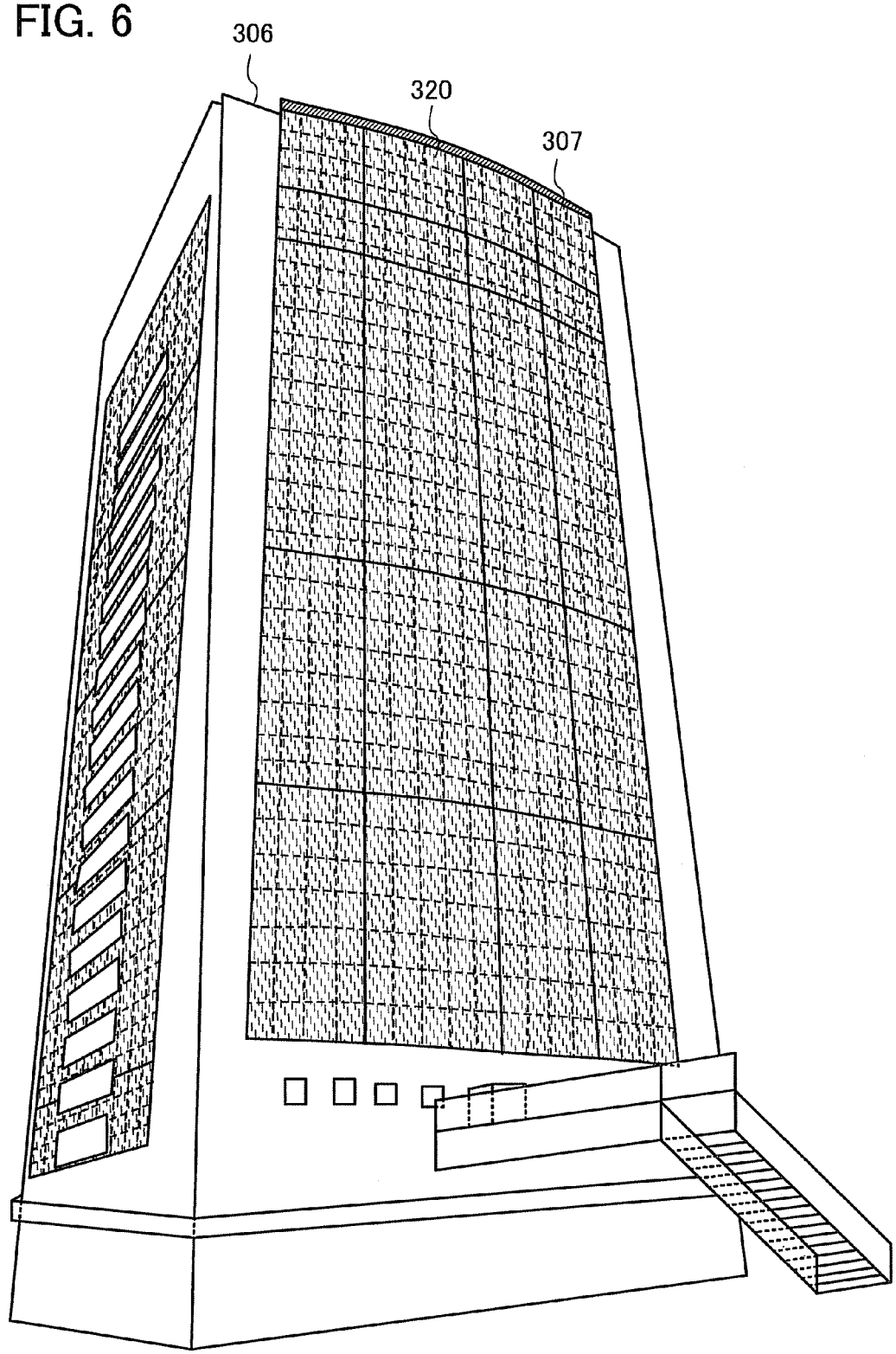
FIG. 6 is a view illustrating an example in which a window of a building is provided with a charging device.

FIG. 6 illustrates an example in which a window of a building is provided with the charging device 320 including a region through which light is transmitted.

FIG. 6 is a perspective view of a building 306. In FIG. 6, a window 307 of the building 306 is provided with the charging device 320 including a region through which light is transmitted. As the charging device 320 in FIG. 6, the charging device 300, the charging device 310, the charging device 330, or the charging device 340 can be used.

Electric power generated and stored in the charging device 320 can be used for motive power of a variety of devices which are provided in the building 306, power source of a lighting device which is provided inside or outside the building 306, or the like.

According to this embodiment, a charging device in which a light-transmitting solar cell and a light-transmitting electric double layer capacitor are overlapped with each other and a charging device in which a light-transmitting solar cell and a light-transmitting lithium ion capacitor are overlapped with each other can be provided.

The light-transmitting solar cell and the light-transmitting electric double layer capacitor are overlapped with each other, whereby an increase in the area occupied by the charging device including the solar cell and the electric double layer capacitor can be suppressed. Alternatively, the light-transmitting solar cell and the lithium ion capacitor are overlapped with each other, whereby an increase in the area occupied by the charging device including the solar cell and the lithium ion capacitor can be suppressed.

This application is based on Japanese Patent Application serial no. 2010-259280 filed with Japan Patent Office on Nov. 19, 2010, the entire, contents of which are hereby incorporated by reference.

What is claimed is:

1. An electric double layer capacitor comprising:
 a first substrate and a second substrate facing each other, wherein each of the first substrate and the second substrate is transparent to visible light;
 a pair of current collectors between the first substrate and the second substrate, wherein the pair of current collectors are provided so as to be perpendicular to the first substrate and the second substrate;

a first active material layer provided on a plane of one of the pair of current collectors and a second active material layer provided on a plane of the other of the pair of current collectors, wherein the planes face each other; and an electrolyte provided in a region surrounded by the first substrate, the second substrate, the first active material layer, and the second active material layer.

2. The electric double layer capacitor according to claim 1, wherein the electrolyte is transparent to visible light.

3. The electric double layer capacitor according to claim 1, wherein a material of the first active material layer and the second active material layer is activated carbon or a polyacenic material.

4. A device comprising:
an electric double layer capacitor;
a solar cell; and
wirings electrically connected to the electric double layer capacitor,
wherein the electric double layer capacitor comprises:
a first substrate and a second substrate facing each other, wherein each of the first substrate and the second substrate is transparent to visible light;
a pair of current collectors between the first substrate and the second substrate, wherein the pair of current collectors are provided so as to be perpendicular to the first substrate and the second substrate;
a first active material layer provided on a plane of one of the pair of current collectors and a second active material layer provided on a plane of the other of the pair of current collectors, wherein the planes face each other; and
an electrolyte provided in a region surrounded by the first substrate, the second substrate, the first active material layer, and the second active material layer,
wherein the solar cell comprises, over a third substrate which is transparent to visible light, a first conductive film which is transparent to visible light, a photoelectric conversion layer provided in contact with the first conductive film, and a second conductive film which is transparent to visible light and provided in contact with the photoelectric conversion layer, and
wherein the electric double layer capacitor and the solar cell are electrically connected to each other through the wirings, the first conductive film, and the second conductive film.

5. The device according to claim 4, wherein the electrolyte is transparent to visible light.

6. The device according to claim 4, wherein a material of the first active material layer and the second active material layer is activated carbon or a polyacenic material.

7. The device according to claim 4, wherein one or more electric double layer capacitor which are the same as the electric double layer capacitor are further provided, wherein the electric double layer capacitors are connected in series.

8. The device according to claim 4, wherein one or more electric double layer capacitor which are the same as the electric double layer capacitor are further provided, wherein the electric double layer capacitors are connected in parallel.

9. The device according to claim 4, wherein the photoelectric conversion layer is any one of an amorphous semiconductor layer, a polycrystalline semiconductor layer, and a microcrystalline semiconductor layer.

10. The device according to claim 4, wherein the photoelectric conversion layer comprises a p-type semiconductor layer, an intrinsic semiconductor layer, and an n-type semiconductor layer.

11. A lithium ion capacitor comprising:
a first substrate and a second substrate facing each other, wherein each of the first substrate and the second substrate is transparent to visible light;
a positive electrode comprising a positive electrode current collector and a positive electrode active material layer and a negative electrode comprising a negative electrode current collector and a negative electrode active material layer between the first substrate and the second substrate, wherein the positive electrode and the negative electrode are provided so as to be perpendicular to the first substrate and the second substrate; and
an electrolyte provided in a region surrounded by the first substrate, the second substrate, the positive electrode active material layer, and the negative electrode active material layer.

12. The lithium ion capacitor according to claim 11, wherein the electrolyte is transparent to visible light.

13. The lithium ion capacitor according to claim 11, wherein a material of the positive electrode active material layer is activated carbon or a polyacenic material.

14. A device comprising:
a lithium ion capacitor;
a solar cell; and
wirings electrically connected to the lithium ion capacitor,
wherein the lithium ion capacitor comprises:
a first substrate and a second substrate facing each other, wherein each of the first substrate and the second substrate is transparent to visible light;
a positive electrode comprising a positive electrode current collector and a positive electrode active material layer and a negative electrode comprising a negative electrode current collector and a negative electrode active material layer between the first substrate and the second substrate, wherein the positive electrode and the negative electrode are provided so as to be perpendicular to the first substrate and the second substrate; and
an electrolyte provided in a region surrounded by the first substrate, the second substrate, the positive electrode active material layer, and the negative electrode active material layer, and
wherein the solar cell comprises, over a third substrate which is transparent to visible light, a first conductive film which is transparent to visible light, a photoelectric conversion layer provided in contact with the first conductive film, and a second conductive film which is transparent to visible light and provided in contact with the photoelectric conversion layer, and
wherein the lithium ion capacitor and the solar cell are electrically connected to each other through the wirings, the first conductive film, and the second conductive film.

15. The device according to claim 14, wherein one or more lithium ion capacitor which are the same as the lithium ion capacitor are further provided, wherein the lithium ion capacitors are connected in series.

16. The device according to claim 14, wherein one or more lithium ion capacitor which are the same as the lithium ion capacitor are further provided, wherein the lithium ion capacitors are connected in parallel.

17. The device according to claim 14, wherein the electrolyte is transparent to visible light.

18. The device according to claim 14, wherein a material of the positive electrode active material layer is activated carbon or a polyacenic material.

19. The device according to claim 14, wherein the photoelectric conversion layer is any one of an amorphous semiconductor layer, a polycrystalline semiconductor layer, and a microcrystalline semiconductor layer.

20. The device according to claim 14, wherein the photoelectric conversion layer comprises a p-type semiconductor layer, an intrinsic semiconductor layer, and an n-type semiconductor layer.

* * * * *